Figure 1:
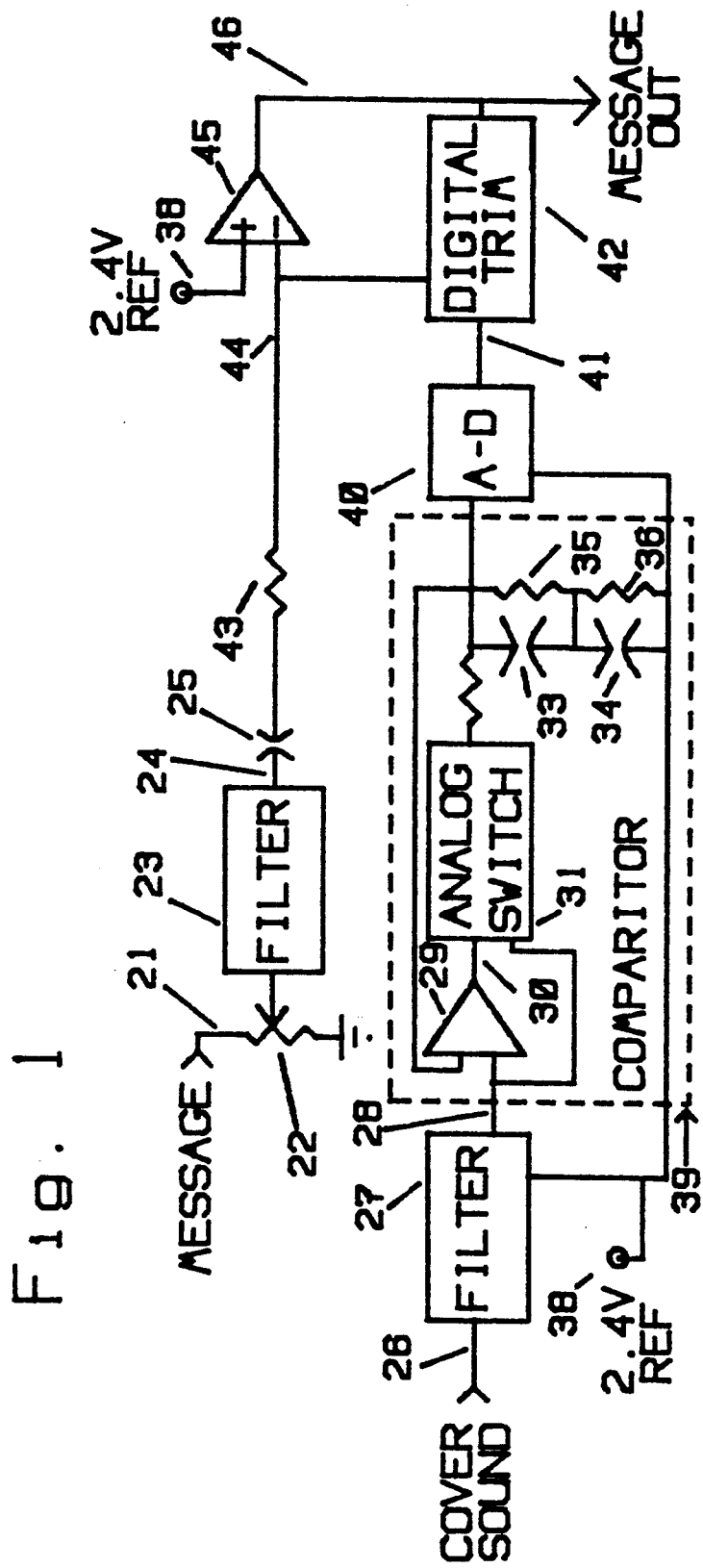

United States Patent [19]

Mikell

[11] Patent Number: 5,245,666
[45] Date of Patent: Sep. 14, 1993

[54] PERSONAL SUBLIMINAL MESSAGING SYSTEM

[76] Inventor: Bruce T. Mikell, P.O. Box 240, Idaho Springs, Colo. 80452

[21] Appl. No.: 711,933

[22] Filed: Jun. 6, 1991

[51] Int. Cl.$^5$ .............................................. H03G 3/20
[52] U.S. Cl. ..................................... 381/73.1; 381/57; 381/108
[58] Field of Search ........................ 381/73.1, 57, 108

[56] References Cited

U.S. PATENT DOCUMENTS

| | | | |
|---|---|---|---|
| 3,160,707 | 12/1964 | Meyers | 381/57 |
| 4,395,600 | 7/1983 | Lundy et al. | 381/73.1 |
| 4,553,257 | 11/1985 | Mori et al. | 381/57 |
| 4,628,526 | 12/1986 | Germer | 381/57 |
| 4,777,529 | 10/1988 | Schultz et al. | 381/73.1 |

OTHER PUBLICATIONS

H. A. Beagley, Audiology and Audiological Medicine, vol. 1, p. 125, 1981.

J. V. Tobias, Foundations of Modern Auditory Theory, vol. 1, 1970, pp. 90–94.
H. Davis and S. R. Silverman, Hearing and Deafness, 1978, p. 41.
Katz et al, eds., Handbook of Clinical Audiology, pp. 170–176 and 1077.

*Primary Examiner*—Forester W. Isen

[57] ABSTRACT

A personal subliminal messaging system includes a wide range linear subliminal modulator (43), a digital audio recording or play device (46), a microphone (51) to pick up the sound at the ear, and an earpiece (50) to deliver the subliminal message. The sound level at the user's ear is detected and measured. After risetime and decay conditioning of the varying dc control signal, the wide range linear modulator (43) uses this signal to control the level of the message to the earpiece (50). The user adjusts the system for a liminal of a subliminal level. The psychoacoustic phenomena of Post Masking is used to increase the integrity of the message in subliminal messaging systems.

17 Claims, 3 Drawing Sheets

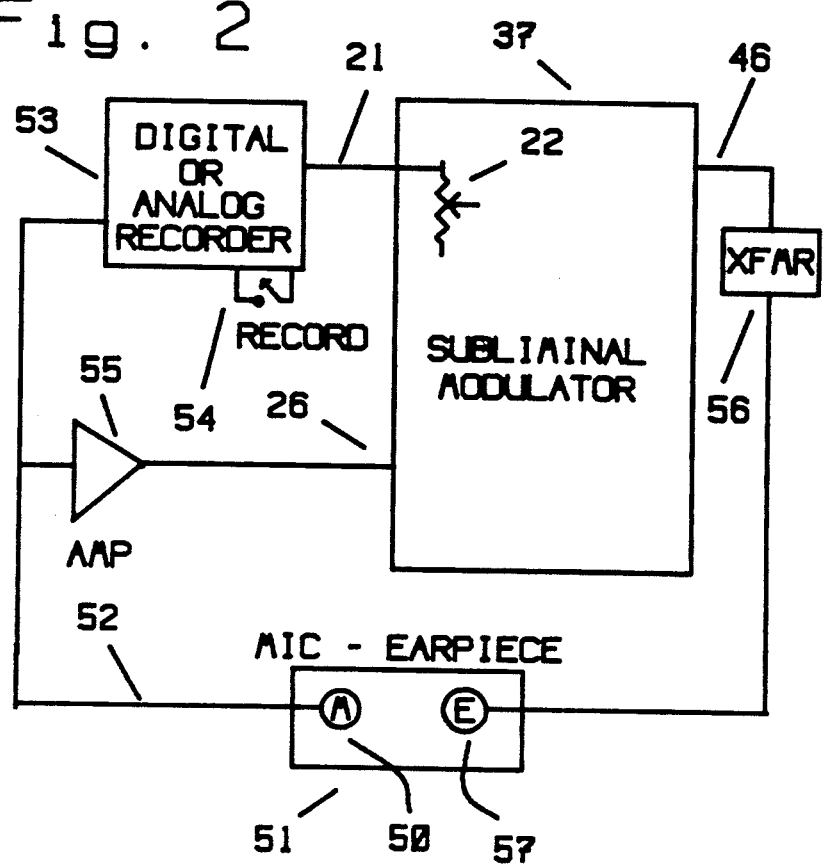
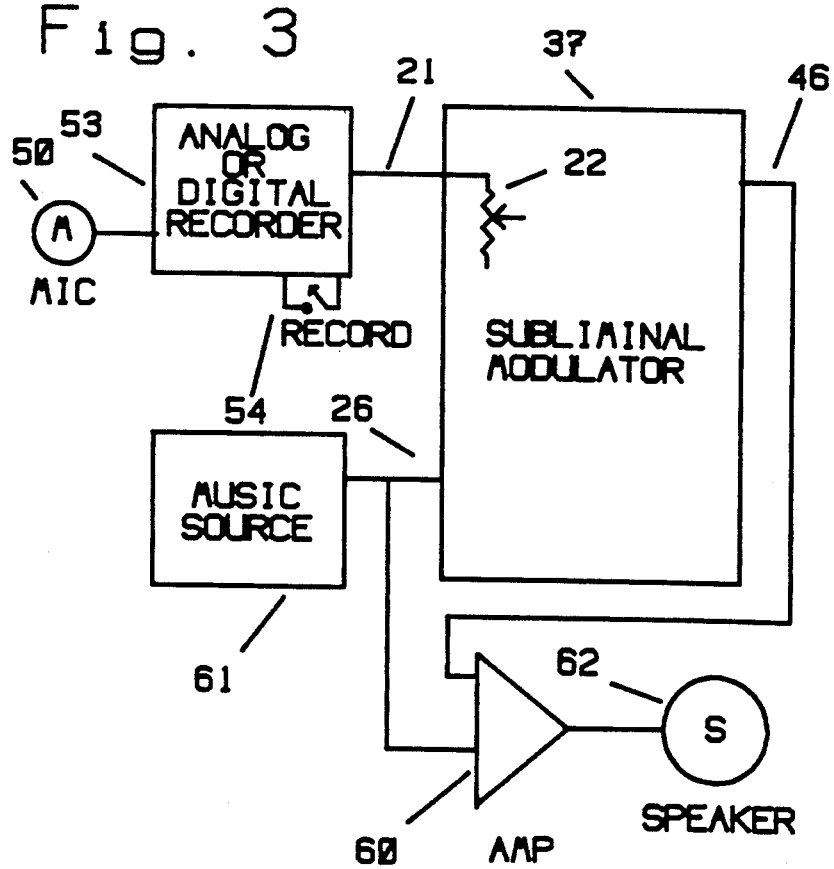

PERSONAL SUBLIMINAL MESSAGING SYSTEM

BACKGROUND

1. Field of Invention

This invention relates generally to auditory subliminal messaging systems, specifically to a system that presents liminal or subliminal messages through an earphone, using the sound, at the ear, as cover for the subliminal message.

2. Description of Prior Art

Subliminal research goes back to the early 1950s in both auditory and visual systems. A search of abstracts in professional journals indicates that over 150 articles and studies on subliminal messaging have been published. Originally, those interested in this subject desired to effect other people's behavior without their knowledge.

Subliminal messaging using sound is accomplished by adjusting a message to a volume below a cover sound, such as music. The message volume is varied in response to the cover sound level to keep it hidden.

Four patents issued on subliminal systems are, U.S. Pat. No. 3,060,795 to Corrigan et al., U.S. Pat. No. 3,278,676 of Becker, U.S. Pat. No. 4,395,600 to Rene R. Lundy et al., and U.S. Pat. No. 4,777,529 to R. M. Schultz et al.

The auditory devices of Becker and Schultz are designed to produce subliminals under controlled circumstances. Disadvantages of these systems are:

a. Both systems uses standard voltage-controlled amplifiers, which, normally, do not have a linear or controllable wide range of operation and both systems could have large errors at low cover signal levels.

b. Linearity is not mentioned in either patent and is surely necessary in a personal system, because of the broad range of sounds that are encountered.

c. Both systems need one or more dual +/− power supplies.

d. Both systems use rectifier or precision rectifier circuits that could surge at very low amplitudes or have a different responses to widely varying amplitudes.

e. Lundy's system was designed with modulation responses to hide the message by reducing the message level quickly with a quick reduction of ambient level and increase it slowly. This tends to keep the message at a very low average level.

f. Schultz's system was designed to change the amplitude of the subliminal message rapidly with a change in the cover sound. This means the subliminal message volume varies greatly and quickly providing a loss of message integrity.

g. None of the prior art is portable or readily adaptable for personal use.

h. None of the prior art is quickly programmed with a desired message.

Presently, subliminal messaging is used successfully in the area of self improvement. Hundreds of prerecorded cassette tapes are available which present positive affirmations, subliminally, to the listener. The tapers are effective, but limited, because the user can't be sure what, if any, message is under the music. Subliminal tapes recordings need modulators that need accurate control over a relatively small volume range, since the music is kept at a relative constant volume and is usually accompanied with the sound of waves. The sound of waves have a broad range of frequencies, which makes it an excellent cover sound.

Researching past studies suggests, subliminal messages are more effective if the listener understands the content of the message and has confidence in it. Relaxation also increases the effectiveness of subliminal messaging.

Presenting subliminal messages over as earphone, in response to the sound at that ear presents a number of problems. The very close and personal distance of the earphone and relative great distance of the controlling sound means that an error made by the modulator can become immediately apparent and annoying to the listener.

There is a need for a system that solves these problems and brings the full power of subliminal messaging to the individual.

SUMMARY

Objects and Advantages

The present invention is a method and system to allow a message to be presented to the user through an earphone at a subliminal level. The system uses the sound, measured at the ear, as the cover sound. This means that an affirmative message may be chosen, recorded, and used, subliminally, within seconds. It is designed to be easy to use, portable and is non-intrusive to the everyday flow of life.

In use, the basic system allows the user to push a button to record an affirmative message on an internal digital-analog storage chip. When the record button is released the message is presented, repeatedly, at the earpiece. The user then adjusts the amplitude ratio control to a liminal or subliminal level.

Music makes the best cover sound, but this system makes it possible to present subliminals in reference to everyday sounds, which can vary more in amplitude and less in frequency distribution than music.

The base system, which is the most acoustically demanding, has been built and is being tested with positive results.

The user understands and has confidence in the message, because he is able to pick and word the affirmative message, as he sees fit and can easily test for the presence of the message during use.

The basic system uses a digital audio storage circuit, but the message signal may be derived from other mediums, such as digital ROM cards or audio cassette tapes.

Accordingly, besides the objects and advantages of the Subliminal Messaging Systems described, several objects and advantages of the present invention are:

a. to provide subliminal messages in an earpiece, in reference to the sound, without overtly effecting the normal hearing in that ear. Earphones and earpieces are presently available to cover this need.

b. to provide a simple and accurate wide range subliminal modulator that is powered by a single 9-volt battery.

c. to provide a subliminal modulator that has a linearity and accuracy of no less than 2% over a voltage range of 40 db and has a consistent response over a wide range of operation.

d. to provide a subliminal modulator having a frequency response to a microphone and modulator, similar to that of the message output.

e. to provide a pocket-sized subliminal messaging system.

h. to provide a subliminal messaging system that is able to produce a liminal message that is comfortable and barely evident to the listener.

g. to produce a subliminal modulator with response that increases the subliminal message amplitude in a stable, controlled fashion and decreases it in a slower fashion to insure message integrity and keep the message at the highest possible level.

h. to produce a subliminal system that takes advantage of forward masking.

Post masking, or forward masking is a psyco-acoustic function in the human auditory system. Forward masking is the ability of one sound to cover or mask another sound that follows it in time. The length of time that forward masking provides cover is affected by the amplitude, duration, and frequency characteristics of both sounds.

In using forward masking, the wide range linear modulator adjusts the subliminal message volume so that it is increased at a steady rate, then decreases at a rate, related to the length of time the cover sound has been at the controlling level. Short transients in the cover sound, such as a single drum beat, will allow the subliminal message volume to quickly decrease again. When the cover sound level has been at a higher level for a longer period of time, the subliminal message volume decay is respectfully slowed, suing forward masking to cover the subliminal message.

DRAWING FIGURES

1. FIG. 1 is a schematic diagram of a wide range linear subliminal modulator in accordance with the present invention.

2. FIG. 2 is a schematic diagram of the system configured to drive an earphone with respect to the sound at the ear.

3. FIG. 3 is a block diagram of the system configured to drive a speaker with the subliminal message and internal cover sound.

Figure 4:
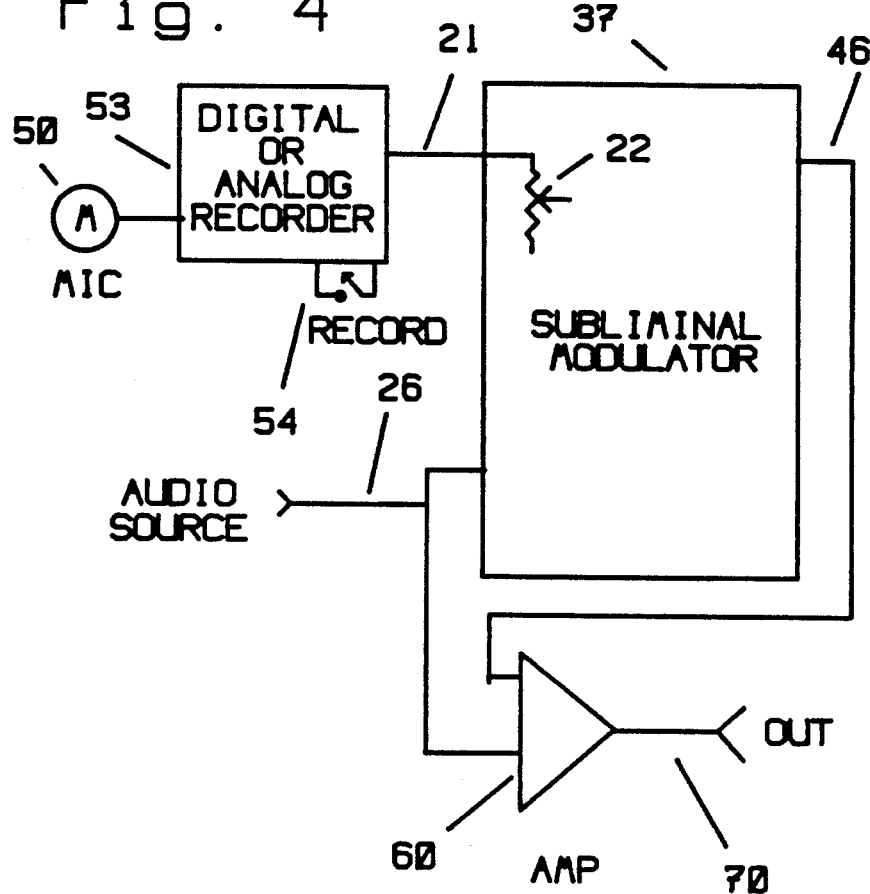

4. FIG. 4 is a block diagram of the system configured to add a subliminal message to an existing audio system.

Figure 5:
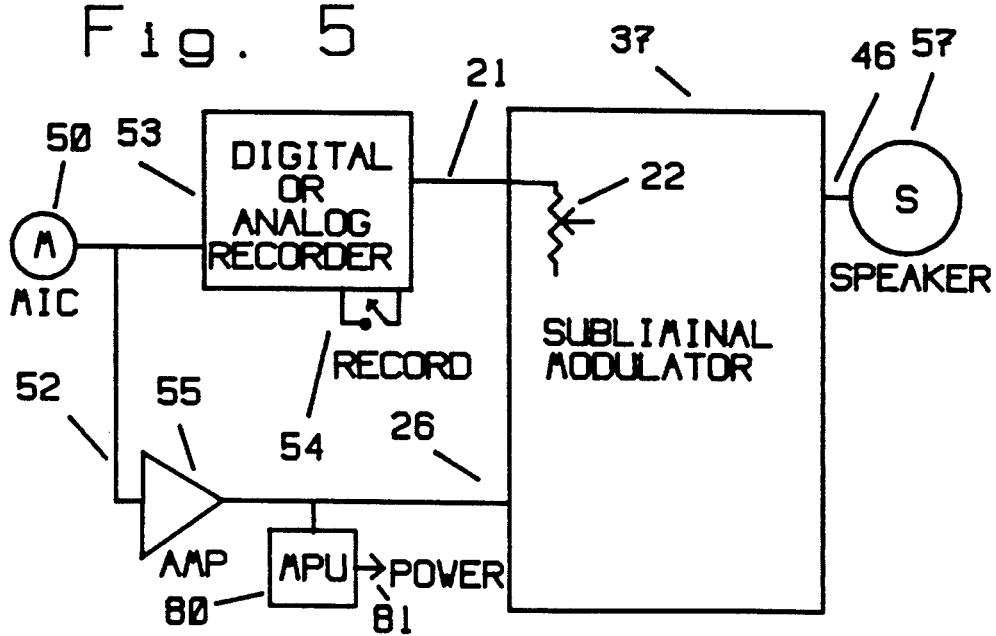

5. FIG. 5 is a block diagram of the system configured to work with auto power up.

DESCRIPTION—FIGS. 1 TO 5

FIG. 1 is an electrical schematic diagram of a wide range subliminal modulator. Power is supplied by a single 9-volt battery #522.

A audio signal to be presented as the subliminal message is supplied on line 21. The ratio control resistor 22 is used to vary the signal amplitude to the bandpass filter 23, which has a bandpass of approximately 400 to 4000 Hz and is output on line 24.

The cover sound is input on line 26 to bandpass filter 27, which has a bandpass of approximately 400 to 4000 hz. Output line 28 is referenced around the 2.4 v reference 38. Amplitude processing circuit 39 is comprised of a comparitor 29, analog switch 31, and rc network 32-36. Comparitor 29 comprises the digital signal from the bandpass filter with the voltage on line 37. If the voltage is lower on line 37, the output 30 of the comparitor 29 goes high, turning the analog switch, charging capacitors 33 and 34 towards the positive voltage peaks. Resistor 32 and capacitors 33 and 34 define the transient risetime characteristics, approx. 20 msec, of the varying dc output 37, while resistors 35 and 36 and capacitors 33 and 34 help determine the variable decay characteristics, approx. 20 to 100 msec. The voltage on line 37 will be used to control the amplitude of the subliminal message.

The digital to analog converter 40 measures the voltage on line 37 in reference to the 2.4 volt reference 38 and outputs a proportionate serial digital word on line 41. A Digital trim resistor 42, such as the Hughes model 2012, reads the serial word on line 41 and presents a proportionate resistance between lines 44 and 46. The gain of amplifier 45 is linearly controlled over the range of the analog to digital converter by the changing of the ratio of resistor 43 to the digital trim resistor 42.

The subliminal message from the bandpass filter 23 on line 24 is passed through capacitor 25. The capacitor 25 also allows the DC function of the amplifier to follow the positive input connected to the 2.4 v reference 38 and insures no DC output due to gain change. The r/c time constant of capacitor 25 and resistor 43 should be no shorter than 0.1 seconds. The modulated signal at output 46 is the subliminal message signal that will eventually be added to the cover sound either electrically or audibly.

FIG. 2 is a schematic diagram of a portable wide range linear subliminal messaging system configured to drive an earphone 57 with the subliminal message, in reference to the sound at the ear. A microphone 50 on the microphone/earphone assembly 51 produces a signal on line 52. If digital analog storage device 53, such as a IDS model 1016, is used, a record switch 54 is closed to store a message. Releasing of the record switch 54, initiates a repeating playback mode on line 21.

The microphone signal 52 also feeds the amp 55 to amplify the microphone signal to the proper amplitude for the cover sound input of modulator 37. Modulator 37 uses the amplitude of the signal 26 from amplifier 55 to modulate audio signal 21 from digital analog storage device 53. The output on line 46 drives a matching transformer 56. Transformer 56 output drives earpiece 57 in microphone/earpiece combination 51.

FIG. 3 obtains both the cover sound and the subliminal message internally. This differs from FIG. 2 in that an audio cover signal source 61 provides a signal on line 26 to both modulator and one summing input of output amp 60. The output of the modulator 46 is applied to the other summing input of output amp 60, which drives speaker 62 or earpiece 57.

FIG. 4 is used to inject a subliminal message into a standard audio system or single channel of a stereo system. The signal from the audio system is input on line 26 to the input of modulator 37 and one summing input of output amplifier 60. The subliminal message signal 46 from the modulator 37 is input to the other summing input of output amplifier 60, where they are added and output 70 to the system.

FIG. 5 is a wide range subliminal message system adapted to power up automatically when a sound source, such as a TV is activated. Microphone amplifier 52 and microprocessor 80 have full time power. The signal amplitude from microphone 50 increases when the TV is turned on. A proper signal amplitude on line 52 causes the microprocessor 80 to provide system power on line 81. Microprocessor 80 continues to monitor the signal on line 81 and decides when to power down the system.

FIG. 2 shows the base subliminal messaging system. The record mode is accomplished by holding record button 54 and speaking into microphone 50. When the message is completed, release the record button 54.

Place earpiece 50 in the ear. Adjust the ratio control 22 to a desired level of liminal or subliminal volume. This should be done in an area with a comfortable amount of sound. The system will self-adjust as the listener moves into areas of other sound levels.

FIG. 3 shows a system that uses an internal receiver or cover signal source 61. A message is recorded by pushing record button 54. The message is automatically available when the record button 54 is released. Receiver 61 is adjusted for the desired program and its volume is adjusted for a comfortable level. The ratio control 22 is then adjusted for the desired liminal or subliminal level.

FIG. 4 is used to inject a subliminal message into an existing system. The subliminal message is programmed as in FIG. 2 or is provided by another source. Lines 21 and 70 are connected into the existing system via connectors like the audio system monitor inputs and outputs. The ratio control 22 is then adjusted for the desired liminal or subliminal level.

FIG. 5 is an automatic subliminal messaging system. A tape is placed in a lockable tape deck 53 or digital analog storage device 53 and microphone 50 is placed near TV speaker 57. The TV is turned on and the volume is set to a comfortable level. The ratio control 22 is adjusted to the desired level. The system will power up and down with the availability of TV sound and adjust the message volume for audible mixing with the TV sound.

SUMMARY, RAMIFICATIONS, AND SCOPE

This subliminal messaging system provides a versatile and simple means of obtaining the power of subliminal messaging without changing the course of the users everyday life. The base design is simple, very easy to use and will fit into a shirt pocket. It is powered by a single 9-volt battery and has a long battery life.

Accordingly, the reader will see that the subliminal messaging system of this invention can, easily and quickly, record and playback subliminal messages. Further more, the subliminal messaging system has the additional advantages in that;
- it provides a portable pocket-sized subliminal messaging system that can be programmed and used in privacy;
- it provides subliminal message integrity by keeping the message volume at a high and relatively constant level;
- it provides a wide range linearity thereby enabling effective use around a wide range of sounds levels.

Linear modulator control of the message signal in the personal mode means this device makes a superior modulator for the room mode or system mode, where the sound of a TV or stereo is sensed and the subliminal message is presented from a speaker. The message combines, audibly, with the entertainment sound. It also provides a high ratio of message volume to cover volume.

This system is, also, wall adapted for use in producing anti-theft subliminal messages in retail stores.

In addition the modulator can also be used in a system mode where an audio signal, such as one channel of stereo is extracted. This signal is measured and reinserted into the system with the subliminal message signal added to it. The audio signal and subliminal signal are supplied to the speaker together.

What has been described are auditory subliminal messaging systems which constitute presently preferred embodiments of the invention. Various changes and modifications will be apparent to those skilled in the art. Digital components of the preferred embodiment may be replaced by equivalent analog components. Modifications may include having all modulator or system functions on one chip. A further modification may be also be adapted with a lockable tape carrier and Auto on-off function for use with a TV. A further modification would carry a cover sound, such as an FM receiver, a subliminal message source and modulator in one portable package. Thus the scope of the invention should not be determined by the appended claims and their legal equivalents, rather than by the examples given.

I claim:

1. A personal subliminal messaging system, comprising;
   means for detecting a cover sound level;
   means for converting said sound level to a varying dc voltage level with a delayed decay characteristic;
   means for detecting a message signal;
   means for modulating said message signal in a linear fashion
      with respect to said varying dc level to provide a modulated message signal such that during a period of falling cover sound level, the rate of decay of said modulated message signal is less than that of the cover sound level such that said system presents a subliminal message utilizing post masking as a subliminal masking technique.

2. The system of claim 1, wherein;
   said means for detecting said cover sound level is a means for detecting sound at a user's ear;
   said means for presenting said modulated message sound is a means to present the modulated message sound at said users ear;
   whereby a portable pocket-sized unit may be used to present subliminal messages in an accurate, private manner and be referenced to the sound at the user's ear.

3. The system of claim 1, further including:
   means for recording said message signal;
   whereby a portable system may be used to record and replay subliminal messages.

4. The system of claim 1, wherein said means for modulating the message signal is characterized by an accuracy of 2% over a voltage range of 40 db.

5. The system of claim 1, wherein;
   said means for converting the sound level to a varying dc voltage is a means to adjust the varying dc voltage level in a variable delayed fashion in respect to the transient characteristics of the cover sound signal;
   whereby post masking may be used as a variable function.

6. The system of claim 1, wherein;
   said means for converting the sound level to a varying dc voltage is a means to adjust the varying dc voltage level in a fashion that has consistent response over a voltage range of no less than 40 db.

7. The system of claim 1, further including means for adjusting the message volume to a liminal level.

8. The system of claim 1, further including means for automatic control of system power in relation to the presence of an entertainment sound.

9. An earpiece/microphone combination for use in presenting subliminal message with respect to sound levels at a user's ear, comprising:

means for detecting the ambient sound level in the area of the user's ear for use in control of subliminal messages;

means for generating a message signal;

means responsive to said ambient sound level for subliminally representing said message signal to the user's ear using an earpiece that does not overtly affect the user's hearing of said ambient sound;

whereby a personal subliminal message may be presented using ambient sound at the user's ear as cover.

10. A personal subliminal messaging system comprising;

means for detecting a cover sound signal;

means for converting said cover sound signal to a varying dc level voltage having slow decay characteristics;

means for detecting a message signal;

means for modulating said message signal in a linear fashion with respect to said cover sound signal and with delayed decay characteristics such that during a period of falling cover sound signal level, the rate of decay of said modulated message signal is less than that of said cover sound signal such that subliminal messages are presented utilizing post masking as a subliminal cover technique.

11. The system of claim 10 further including;

means for recording said message signal;

means for playing back said message signal;

whereby a portable system may be used to record and replay subliminal messages.

12. The system of claim 10, wherein;

said means for detecting a cover sound signal is a means for detecting sound at a user's ear;

said means for presenting said modulated message signal is a means to present the modulated message at said user's ear;

whereby a portable pocket-sized unit may be used to present subliminal messages in an accurate, private manner and be referenced to the sound at the user's ear.

13. The system of claim 10, further including means for adjusting the message volume to a liminal level.

14. The system of claim 10, further including:

means for producing said cover sound signals;

whereby a portable system may provide entertainment sound combined with a subliminal message.

15. The system of claim 10, wherein said means for modulating the message signal is characterized by an accuracy of 2% over a voltage range of 40 db.

16. The system of claim 10, wherein;

said means for converting said cover sound signal to a varying dc voltage is a means to adjust the varying dc voltage level in a variable delayed fashion in respect to the transient characteristic of the cover sound signal;

whereby forward masking may be used as a cover technique while maintaining proper response to short transients of the cover sound.

17. The system of claim 10, wherein;

said means for converting the cover sound signal a varying dc voltage is a means to adjust the varying dc voltage level in a fashion that has consistent response over a voltage range of 40 db.

* * * * *